United States Patent
Okumura et al.

(10) Patent No.: US 8,497,791 B2
(45) Date of Patent: Jul. 30, 2013

(54) OPERATIONAL AMPLIFIER

(75) Inventors: Atsushi Okumura, Hamura (JP); Ryusuke Sahara, Mitaka (JP); Mitsugu Kusunoki, Kunitachi (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 13/468,126

(22) Filed: May 10, 2012

(65) Prior Publication Data

US 2012/0293353 A1    Nov. 22, 2012

(30) Foreign Application Priority Data

May 20, 2011    (JP) .................................. 2011-113027

(51) Int. Cl.
*H03M 1/10*    (2006.01)
(52) U.S. Cl.
USPC ............................... 341/121; 341/145; 330/86
(58) Field of Classification Search
USPC ................................................. 341/121, 145
See application file for complete search history.

(56) References Cited

U.S. PATENT DOCUMENTS

| | | | | |
|---|---|---|---|---|
| 6,633,246 B1 * | 10/2003 | Bowers | ........................ | 341/136 |
| 7,352,238 B2 * | 4/2008 | Elwan et al. | .................... | 330/86 |
| 7,423,482 B2 * | 9/2008 | Blon | ............................... | 330/86 |

FOREIGN PATENT DOCUMENTS

| JP | 2006-319388 A | 11/2006 |
|---|---|---|
| JP | 2007-158771 A | 6/2007 |

* cited by examiner

*Primary Examiner* — Khai M Nguyen
(74) *Attorney, Agent, or Firm* — Miles & Stockbridge P.C.

(57) ABSTRACT

A temperature dependence adjustable operational amplifier circuit which suppresses a change in a gain caused by a change in an input voltage is provided. In an operational amplifier including a first input terminal and an output terminal, an operational amplifier having an inverting input terminal and a non-inverting input terminal, an input resistance circuit, and a feedback resistance circuit, each of the input and feedback resistor circuits has a resistor and a trimming resistor, which are different in temperature coefficient from each other, connected in series with each other, and a source-drain path of a MOS transistor included in the trimming resistor circuit is disposed between resistance and an inverting input terminal, and a substrate potential thereof is set to a potential of the inverting input terminal of the operational amplifier.

14 Claims, 4 Drawing Sheets

$$R \propto \frac{1}{(Vgs-Vth)}$$

R: ON-RESISTANCE
Vgs: GATE-SOURCE VOLTAGE
Vth: THRESHOLD VOLTAGE

OPERATIONAL AMPLIFIER

CLAIM OF PRIORITY

The present application claims priority from Japanese patent application JP 2011-113027 filed on May 20, 2011, the content of which is hereby incorporated by reference into this application.

FIELD OF THE INVENTION

The present invention relates to an amplifier circuit that can adjust temperature dependence.

BACKGROUND OF THE INVENTION

Up to now, operational amplifiers that amplify signals have been known. Japanese Unexamined Patent Application Publication No. 2006-319388 discloses, in FIG. 1 thereof, an example in which a circuit in which a DMOS of an on-resistance having a temperature dependence and a resistor having a temperature dependence opposite to that of the on-resistance of the DMOS are connected in series to each other is combined with the operational amplifier to reduce the temperature dependence of a gain of the operational amplifier circuit.

Japanese Unexamined Patent Application Publication No, 2007-158771 discloses, in FIG. 1 thereof, an example of configuration in which a nonvolatile memory that stores a control value of a switch designed such that anon-resistance of the switch becomes a resistance, value that allows the temperature dependence of an overall system to be canceled therein is combined with an operational amplifier to reduce the temperature dependence of the gain of the operational amplifier circuit.

SUMMARY

In general, the circuit has a temperature dependence attributable to the characteristic of an element. For the purpose of reducing the temperature dependence, there has been known a method using circuits whose characteristics are determined according to a ratio of the characteristics of the elements. A differential circuit is also a type of those circuits. However, even in such circuits, there occurs an error having the temperature dependence occurs due to asymmetry caused by a manufacturing error. As a method of reducing the temperature dependence, there has been known a method of reducing the manufacturing error by using an element having a large area. However, this method is associated with an adverse effect that the circuit is upsized. As another method, there has been known a method in which the temperature dependence is canceled by using a current having the temperature dependence. However, this method is associated with an increase in power consumption.

For example, the example of Japanese Unexamined Patent Application Publication No. 2006-319388 poses such a problem that the on-resistance of the switch is changed depending on an input voltage of the operational amplifier, and the gain is changed depending on an input voltage. Like Japanese Unexamined Patent Application Publication No. 2006-319388, the example of Japanese Unexamined Patent Application Publication No. 2007-158771 suffers from such a problem that when the MOS switch whose on-resistance has the voltage dependence is used, the on-resistance of the switch is changed depending on the input voltage, and the gain is changed depending on the input voltage.

According to one aspect of the present invention, there is provided an operational amplifier including: a first input terminal and an output terminal; an operational amplifier having an inverting input terminal and a non-inverting input terminal; a first input resistance circuit that is disposed between the first input terminal and the inverting input terminal of the operational amplifier; and a feedback resistance circuit that is disposed between the output terminal and the inverting input terminal of the operational amplifier, wherein the non-inverting input terminal of the operational amplifier is connected to a reference potential, wherein the first input resistance circuit has a first resistor and a second resistor including a MOS transistor, which are different in temperature coefficient from each other, connected in series with each other, wherein the feedback resistor circuit has a third resistor and a fourth resistor including a MOS transistor, which are different in temperature coefficient from each other, connected in series with each other, wherein a source-drain path of the MOS transistor of the second resistor is disposed between the first resistor and the inverting input terminal of the operational amplifier, wherein a source-drain path of the MOS transistor of the fourth resistor is disposed between the third resistor and the inverting input terminal of the operational amplifier, and wherein substrate potentials of the MOS transistors of the second resistor circuit and the fourth resistor circuit are set to a potential of the inverting input terminal of the operational amplifier.

The temperature dependence of the operational amplifier, is adjusted.

DETAILED DESCRIPTION OF THE PREFERRED EMBODIMENTS

First Embodiment

Hereinafter, an embodiment of the present invention will be described. An operational amplifier described below is incorporated into a semiconductor chip (semiconductor integrated circuit), and used as an amplifier that amplifies a signal. The operational amplifier circuit of this type is intended to amplify and output an analog signal, for example, in a digital-to-analog converter (DAC).

Figure 1:
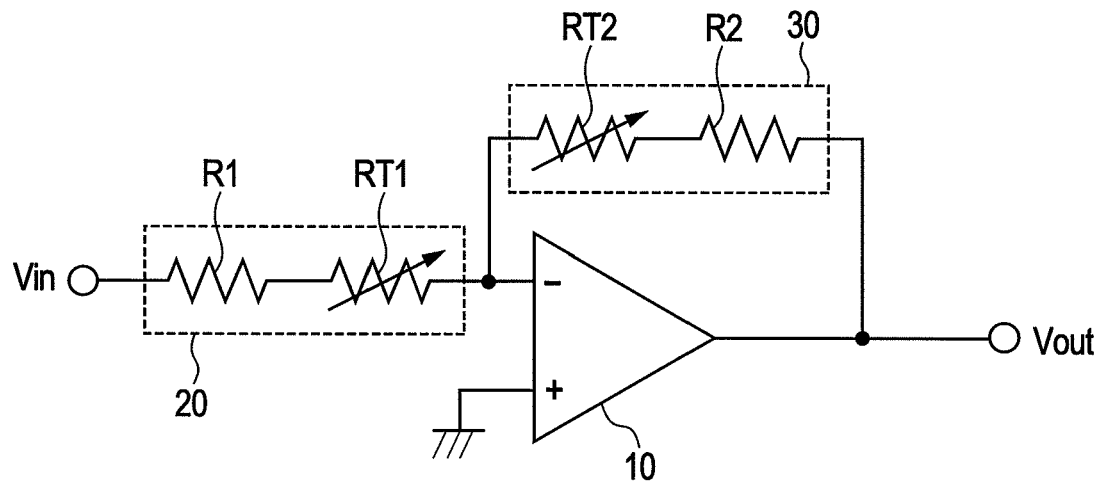
FIG. 1 is a circuit diagram of an operational amplifier circuit according to a first embodiment.

FIG. 1 is a circuit diagram of an operational amplifier circuit according to a first embodiment. As illustrated in FIG. 1, the operational amplifier circuit includes an operational amplifier 10, an input resistance circuit 20, and a feedback resistance circuit 30. The operational amplifier 10 has two input terminals of an inverting input terminal (−) and a non-inverting input terminal (+). The inverting input terminal (−) is connected to an input terminal through the input resistance circuit 20, and to an output terminal through the feedback resistance circuit 30. The non-inverting input terminal (+) is connected with a reference potential (ground).

A voltage gain of this circuit is determined according to the input resistance circuit 20 and the feedback resistance circuit 30. The input resistance circuit 20 has a resistor R1 and a trimming resistor RT1 connected in series with each other. In the present invention, at least one of the input resistance circuit and the feedback resistance circuit is configured by connecting two resistors different in temperature coefficient in series with each other to control the temperature dependence of the gain of the operational amplifier circuit.

In the input resistance circuit 20, the resistor R1 and the trimming resistor RT1 may be different in the temperature coefficient from each other, but from the viewpoint of trimability, it is desirable that the resistor R1 is made of a metal relatively small in the temperature coefficient, and the trimming resistor RT1 is connected in parallel with a series connection of a resistor and a MOS switch, which are relatively large in the temperature coefficient. The resistor R1 can be configured by using a thin film metal resistor formed in a wiring layer. For example, the thin film metal resistor can be made of TaN.

If the temperature coefficient of the resistor R1 is negligibly small, and the temperature coefficient of the resistor RT1 can be linearly approximated, a resistance value R20 of the input resistance circuit 20 is represented by Expression 1.

$$R20 = R1 + RT1 \times (1 + C1\Delta T) \quad \text{(Ex. 1)}$$

where R1 is a resistance value of the resistor R1, RT1 is a resistance value of the resistor RT1 at a reference temperature, C1 is a primary temperature coefficient of the trimming resistor RT1, and $\Delta T$ is a temperature difference from the reference temperature.

As with the input resistance circuit 20, the feedback resistance circuit 30 has a resistor R2 and a trimming resistor RT2, which are different in the temperature coefficient, connected in series with each other. Likewise, it is desirable that the resistor R2 is made of a metal relatively small in the temperature coefficient, and the trimming resistor RT1 is relatively large in the temperature coefficient.

If the temperature coefficient of the resistor R2 is negligibly small, and the temperature coefficient of the resistor RT2 can be linearly approximated, a resistance value R30 of the input resistance circuit 30 is represented by Expression 2.

$$R30 = R2 + RT2 \times (1 + C2\Delta T) \quad \text{(Ex.)}$$

where R2 is a resistance value of the resistor R2, RT2 is a resistance value of the resistor RT2 at a reference temperature, C2 is a primary temperature coefficient of the resistor RT2, and $\Delta T$ is a temperature difference from the reference temperature.

The operational amplifier having a connection relationship illustrated in FIG. 1 has inverting amplification operation, and a potential of the inverting input terminal (−) becomes 0 V (reference voltage). For that reason, a relationship of Expression 3 is met between the input signal voltage Vin and an output signal voltage Vout.

$$V\text{out} = 0 - (V\text{in}/R20) \times R30 = -(R30/R20) \times V\text{in} \quad \text{(Ex. 3)}$$

Hence, the following expression is satisfied.

$$V\text{out}/V\text{in} = -R30/R20 \quad \text{(Ex. 4)}$$

-continued
$$= -\frac{\{R2 + RT2 \times (1 + C2\Delta T)\}}{\{R1 + RT1 \times (1 + C1\Delta T)\}}$$

Thus, the gain is represented by a function of $\Delta T$, and the temperature dependence of the gain can be adjusted. For example, when R2=R1, C1=C2=C, and R1>>RT1(1+C$\Delta$T) are satisfied, Expression 5 can be approximated by Expression $$\begin{aligned} V\text{out}/V\text{in} &= -\frac{\{R1 + RT2 \times (1 + C\Delta T)\}}{\{R1 + RT1 \times (1 + C\Delta T)\}} \quad \text{(Ex. 5)} \\ &= -\frac{\{R1 + RT1 \times (1 + C\Delta T) + (RT2 - RT1) \times (1 + C\Delta T)\}}{\{R1 + RT1 \times (1 + C\Delta T)\}} \\ &= -\frac{\{1 + (RT2 - RT1) \times (1 + C\Delta T)\}}{\{R1 + RT1 \times (1 + C\Delta T)\}} \\ &\approx -\left\{\frac{1 + \Delta RT \times (1 + C\Delta T)}{R1}\right\} \end{aligned}$$

where $\Delta RT = RT2 - RT1$

Thus, the gain Vout/Vin is approximated by a linear expression of $\Delta T$. From the viewpoint of Expression 5, it is desirable that the value of R1 is larger than $\Delta RT$. This is because an offset of $|\Delta RT/R1|$ occurs in the gain. Accordingly, it is desirable that the resistor R1 is small in the temperature coefficient and large in the resistance value. Also, it is desirable that a temperature coefficient C of the resistor RT1 is large. This is because the sensitivity to $\Delta T$ is enhanced.

Figure 2:
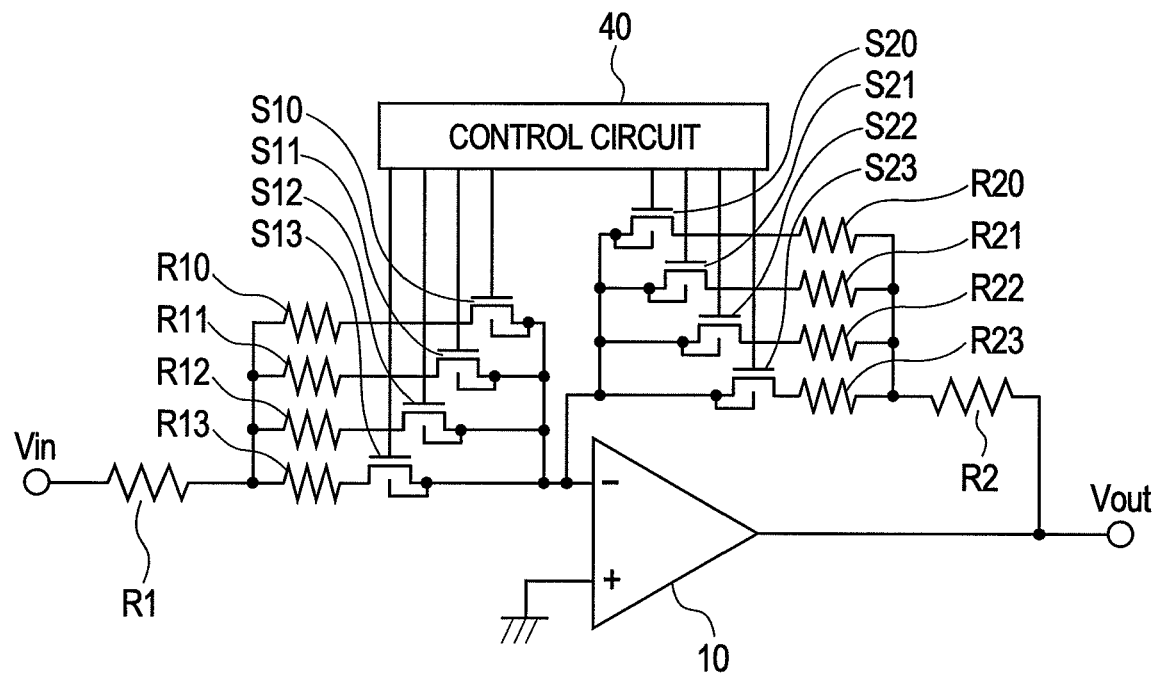
FIG. 2 is a circuit diagram of the operational amplifier circuit according to the first embodiment.

A specific circuit of the resistor RT1 and the trimming resistor RT2 is illustrated in FIG. 2. In the trimming resistor RT1, MOS transistors S10 to S13 connected in series with resistors R10 to R13 large in the temperature coefficient, respectively, are connected in parallel to each other. Likewise, in the trimming resistor RT2, MOS transistors S20 to S23 connected in series with resistors R20 to R23 large in the temperature coefficient, respectively, are connected in parallel to each other. It is needless to say that the number of parallel connections as the trimming resistor is not limited to 4.

Figure 3:
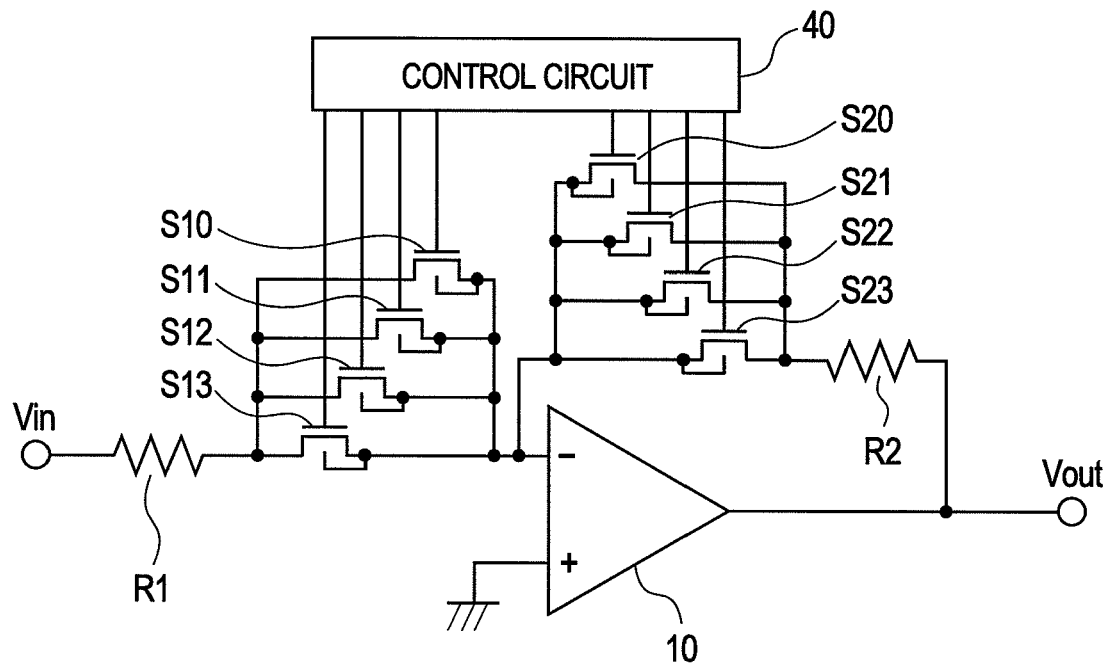
FIG. 3 is a circuit diagram of the operational amplifier circuit according to the first embodiment.

Also, since the MOS transistor is large in the temperature dependence of the on-resistance, the on-resistance per se of the MOS switch may be used as a resistor as illustrated in FIG. 3. A control circuit 40 changes the number of MOS transistors to be turned on in the trimming resistor RT1 and the trimming resistor RT2. It is desirable that the respective resistors R10 to R13 and R20 to R23, or the respective MOS transistors S10 to S13 and S20 to S23 are formed of the same elements. This makes it possible to reduce manufacturing variations. The control circuit 40 changes the number of MOS transistors to be turned on, thereby controlling the temperature dependence of the gain of the operational amplifier circuit.

Figure 4:
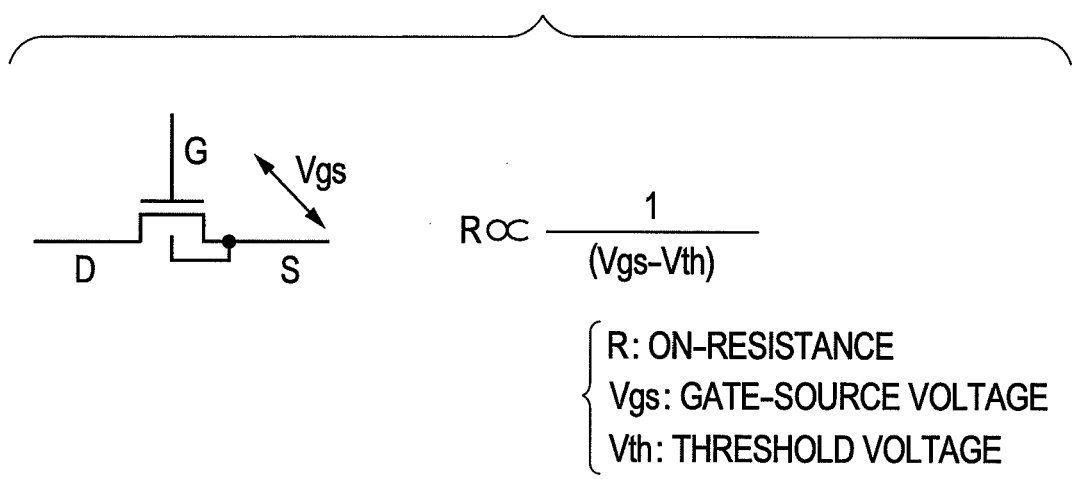
FIG. 4 is a diagram illustrating an on-resistance of a MOS transistor.

In this example, in the configuration of FIG. 2 or 3, the respective source-drain paths of the MOS transistors S10 to S13 and S20 to S23 are disposed between the resistor R and the inverting input terminal (−) of the operational amplifier 10, and substrates thereof are connected to the inverting input terminal (−) of the operational amplifier 10. In general, as illustrated in FIG. 4, the on-resistance of the MOS switch changes depending on the input voltage and a substrate voltage. Under the circumstances, the substrates and the sources of the MOS transistors configuring the trimming resistor are connected to the inverting input terminal (−) of the operational amplifier 10 having no voltage change. With this configuration, the on-resistance of the MOS transistors can be prevented from fluctuating depending on the input voltage, and therefore the gain of the operational amplifier can be prevented from changing depending on the input voltage.

The control circuit 40 controls the on/off operation of the MOS transistors of the trimming resistor so as to provide a combined resistance obtaining a desired temperature dependence of the operational amplifier. More specifically, the control circuit 40 calculates a resistance value at which the temperature dependence becomes optimum, from the measurement result. The measurement result is obtained by measuring output voltages at multiple temperatures. A storage element for controlling the on/off operation of the MOS transistors is included in the control circuit 40. As the storage element, there can be applied a nonvolatile such as a fuse made of polysilicon or aluminum, a programmable ROM, or a flash memory. If a rewritable memory is applied as the storage element, calculated values are set and measured, and optimum values are recalculated from the measurement results, and reset and remeasured, thereby being capable of finding a real optimum value involving the manufacturing error of the characteristics of the element. Thus, more detailed adjustment can be conducted. The control circuit 40 can be omitted if no detailed adjustment is required.

Figure 5:
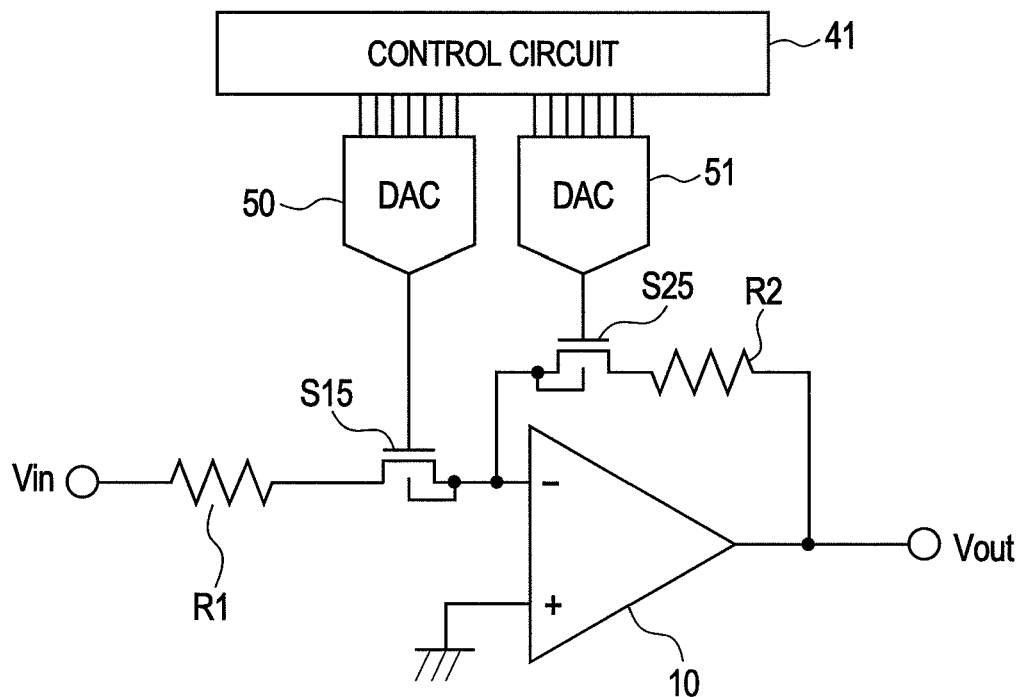
FIG. 5 is a circuit diagram of an operational amplifier circuit according to the first embodiment.

Also, digital-to-analog converters (DAC) 50 and 51 can be added to an output part of a control circuit 41 as illustrated in FIG. 5 to control respective analog voltages to be applied to gates of MOS transistors S15 and S25. One MOS transistor can be provided with multiple on-resistance values so that the temperature dependence can be adjusted by one MOS transistor in each of the input resistance circuit and the feedback resistance circuit. Similarly, in this case, a source-drain path of a transistor S is disposed between the resistor R and the inverting input terminal (−) of the operational amplifier 10, and a substrate thereof is connected to the inverting input terminal (−) of the operational amplifier 10, so that the substrate and the source of the MOS transistor is connected to the inverting input terminal (−) of the operational amplifier 10 having a no voltage change.

Second Embodiment

Figure 6:
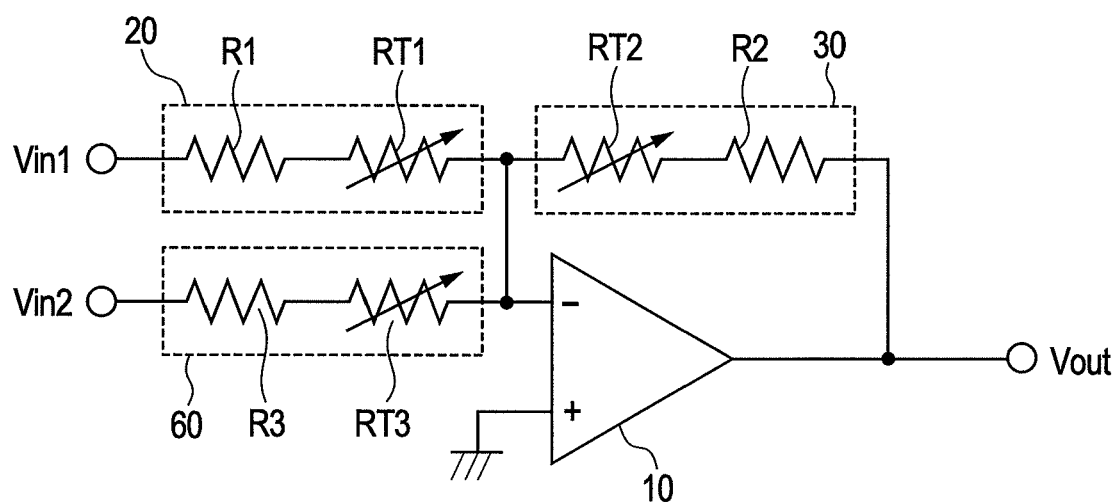
FIG. 6 is a circuit diagram of an operational amplifier circuit according to a second embodiment.

In FIG. 6, a second input resistance circuit 60 is added to provide two input terminals of Vin1 and Vin 2 with respect to the configuration of the first embodiment.

$$Vout = 0 - \{(Vin1/R20) + (Vin2/R60)\} \times R30 \quad \text{(Ex. 6)}$$
$$= -(R30/R20) \times Vin1 - (R30/R60) \times Vin2$$

where R20 is a resistance value of the first input resistance circuit 20, R60 is a resistance value of the second input resistance circuit 60, and R30 is a resistance value of the feedback resistance circuit 30.

Also, as in the first embodiment, the resistance values of the respective resistance circuits are represented as follows.

$$R20 = R1 + RT1 \times (1 + C1\Delta T) \quad \text{(Ex. 7)}$$

$$R30 = R2 + RT2 \times (1 + C2\Delta T) \quad \text{(Ex. 8)}$$

$$R60 = R3 + RT3 \times (1 + C3\Delta T) \quad \text{(Ex. 9)}$$

where Ri (i=1, 2, 3, the same hereinafter) is a resistance value of a resistor R1, RTi is a resistance value of the resistor RTi at the reference temperature, Ci is a primary temperature coefficient of the resistor RTi, and ΔT is a temperature difference from the reference temperature.

$$Vout = -(R30/R20) \times Vin1 - (R30/R60) \times Vin2$$
$$= -\frac{\{R2 + RT2 \times (1 + C2\Delta T)\}}{\{R1 + RT1 \times (1 + C1\Delta T)\}} \times Vin1$$
$$-\frac{\{R2 + RT2(1 + C2\Delta T)\}}{\{R3 + RT3(1 + C3\Delta T)\}} \times Vin2$$

where if C1=C2=C3=C, R2=R1=R3, R1>>RT1×(1+CΔT), and R3>>RT3×(1+CΔT) are satisfied, Vout is approximated as follows.

$$Vout \sim -(1+\Delta RT1/R1+\Delta RT1/R1 \times C\Delta T) \times Vin1 - (1+\Delta RT3/R1+\Delta RT3/R1 \times C\Delta T) \times Vin2 \quad \text{(Ex. 10)}$$

where ΔRT1=RT2−RT1, ΔRT3=RT2−RT3

In the operational amplifier of the second embodiment, if the temperature dependences of both of the gain of Vin1 and an offset that is an initial voltage not depending on the gain of Vin1 are intended to be adjusted, a fixed reference voltage having a given potential is also applied to Vin2 to cancel the temperature dependence of the offset voltage. By adjusting the trimming resistance values RT1, RT2, and RT3, as a result, the temperature dependences of both of the gain and the offset can be adjusted independently. Although not shown, the trimming resistors of the first input resistance circuit 20, the second input resistance circuit 60, and the feedback resistance circuit 30 are configured as illustrated in FIGS. 2, 3, and 5 of the first embodiment, and controlled.

Third Embodiment

Figure 7:
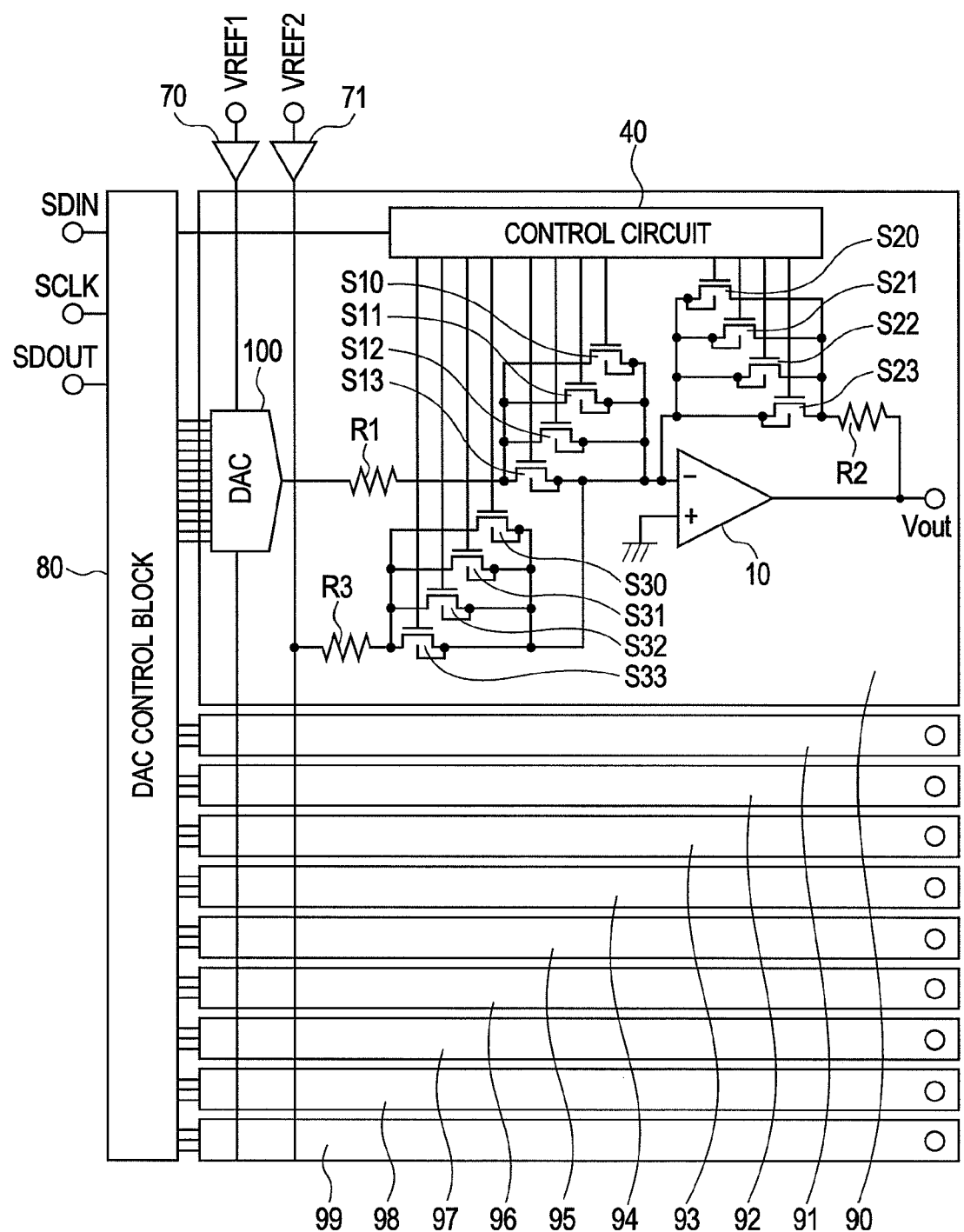
FIG. 7 is a circuit diagram of a DAC according to a third embodiment.

In FIG. 7, the operational amplifier circuit of the present invention is connected to an output part of a digital-to-analog converter (hereinafter referred to as "DAC") 100 so as to configure the DAC having a desired temperature dependence. Also, if the DAC has the temperature dependence, the temperature dependence can be canceled by the operational amplifier circuit of the present invention to obtain a DAC output small in the temperature dependence.

In FIG. 7, when multiple DACs is integrated into one semiconductor chip, common circuits such as buffers 70 and 71 supplying a reference voltage of each DAC may be shared by multiple DACs for the purpose of reducing a circuit scale. In this case, both of the buffers 70, 71 and the individual DACs 100 may have the temperature dependence. In the configuration illustrated in FIG. 7, a mounting position of the operational amplifier circuit is located on the output part, and the temperature dependence is adjusted on the output part that receives a signal added with both of the temperature dependences so that the temperature dependence can be adjusted taking both the temperature dependences of the buffers 70, 71 and the individual DACs 100 into account. As a result, a reduction of the circuit scale by commonalizing the circuits is facilitated.

Also, if the operational amplifier circuit according to the present invention is mounted, a reduction in the temperature dependence of the DAC is not essential. For that reason, for example, there is no need to configure the DAC by a large element for the purpose of reducing the temperature dependence of the DAC caused by the manufacturing error. Also, from this viewpoint, the overall circuit scale can be reduced.

Also, because the operational amplifier circuit can be configured by merely adding the trimming resistors and the control circuit to the output buffer, an increase in the circuit scale with addition of this circuit is small, and there is no increase in the current due to addition of a current source. This circuit can be applied with a small circuit scale and a low power.

What is claimed is:

1. An operational amplifier circuit comprising:
a first input terminal and an output terminal;
an operational amplifier having an inverting input terminal and a non-inverting input terminal;
a first input resistance circuit that is disposed between the first input terminal and the inverting input terminal of the operational amplifier; and
a feedback resistance circuit that is disposed between the output terminal and the inverting input terminal of the operational amplifier,
wherein the non-inverting input terminal of the operational amplifier is connected to a reference potential,
wherein the first input resistance circuit has a first resistor and a second resistor including a MOS transistor, which are different in temperature coefficient from each other, connected in series with each other,
wherein the feedback resistor circuit has a third resistor and a fourth resistor including a MOS transistor, which are different in temperature coefficient from each other, connected in series with each other,
wherein a source-drain path of the MOS transistor of the second resistor is disposed between the first resistor and the inverting input terminal of the operational amplifier,
wherein a source-drain path of the MOS transistor of the fourth resistor is disposed between the third resistor and the inverting input terminal of the operational amplifier, and
wherein substrate potentials of the MOS transistors of the second resistor and the fourth resistor are set to a potential of the inverting input terminal of the operational amplifier.

2. The operational amplifier circuit according to claim 1, further comprising a control circuit,
wherein each of the second resistor and the fourth resistor has a plurality of MOS transistors connected in parallel to each other, and
wherein the control circuit controls on/off operation of the MOS transistors in each of the second resistor and the fourth resistor.

3. The operational amplifier circuit according to claim 2,
wherein in each of the second resistor and the fourth resistor, a plurality of MOS transistors and resistors connected in series with respective source-drain lines of the MOS transistors, are connected in parallel to each other, and
wherein the source-drain paths of the MOS transistors of the second resistor and the fourth resistor are disposed between the resistors connected in series to the MOS transistors and the inverting input terminal of the operational amplifier.

4. The operational amplifier circuit according to claim 1, further comprising a control circuit,
wherein the control circuit controls an analog voltage to be applied to gates of the MOS transistors of the second resistor and the fourth resistor to control the on-resistance of the MOS transistor.

5. The operational amplifier circuit according to claim 1, wherein the first resistor and the third resistor each comprise a thin film metal resistor formed in a wiring layer.

6. The operational amplifier circuit according to claim 1, further comprising:
a second input terminal; and
a second input resistor circuit that is disposed between the second input terminal and the inverting input terminal of the operational amplifier,
wherein the second input resistor circuit has a fifth resistor and a sixth resistor including a MOS transistor, which are different in temperature coefficient from each other, connected in series with each other,
wherein a source-drain path of the MOS transistor of the sixth resistor is disposed between the fifth resistor and the inverting input terminal of the operational amplifier,
wherein a substrate potential of the MOS transistor of the sixth resistor is set to a potential of the inverting input terminal of the operational amplifier, and
wherein a given reference voltage is applied to the second input terminal.

7. The operational amplifier circuit according to claim 6, further comprising a control circuit,
wherein the second resistor, the fourth resistor, and the sixth resistor each include a plurality of MOS transistors connected in parallel to each other, and
wherein the control circuit controls on/off operation of the MOS transistors of the second resistor circuit, the fourth resistor circuit, and the sixth resistor circuit.

8. The operational amplifier circuit according to claim 6, further comprising a control circuit,
wherein the control circuit controls analog voltages to be applied to the gates of the MOS transistors of the second resistor, the fourth resistor, and the sixth resistor to control the on-resistances of the MOS transistors.

9. The operational amplifier circuit according to claim 6, wherein the first resistor, the third resistor, and the fifth resistor each comprise a thin film metal resistor formed in a wiring layer.

10. A semiconductor integrated circuit device, comprising:
a plurality of digital-to-analog converters; and
a reference voltage buffer that applies a given reference voltage to the digital-to-analog converters,
wherein outputs of the digital-to-analog converters are output through an operational amplifier,
wherein the operational amplifier includes a control device, an input terminal that receives the outputs of the digital-to-analog converters, an output terminal, and an operational amplifier having an inverting input terminal and a non-inverting input terminal, an input resistance circuit that is disposed between the first input terminal and the inverting input terminal of the operational amplifier, and a feedback resistance circuit that is disposed between the output terminal and the inverting input terminal of the operational amplifier,
wherein the non-inverting input terminal of the operational amplifier is connected to a reference potential,
wherein the input resistance circuit has a first resistor and a second resistor including a MOS transistor, which are different in temperature coefficient from each other, connected in series with each other,
wherein the feedback resistor circuit has a third resistor and a fourth resistor including a MOS transistor, which are different in temperature coefficient from each other, connected in series with each other,
wherein a source-drain path of the MOS transistor of the second resistor is disposed between the first resistor and the inverting input terminal of the operational amplifier,
wherein a source-drain path of the MOS transistor of the fourth resistor is disposed between the third resistor and the inverting input terminal of the operational amplifier,
wherein substrate potentials of the MOS transistors of the second resistor and the fourth resistor are set to a potential of the inverting input terminal of the operational amplifier, and wherein the MOS transistors of the second resistor and the fourth resistor are controlled by the control circuit.

11. The semiconductor integrated circuit device according to claim 10,
wherein the second resistor and the fourth resistor each have a plurality of MOS transistors connected in parallel to each other, and
wherein the control circuit controls on/off operation of the MOS transistors in each of the second resistor and the fourth resistor.

12. The semiconductor integrated circuit device according to claim 11, wherein the control circuit controls the on/off operation of the MOS transistors in each of the second resistor and the fourth resistor so as to cancel the temperature dependence of the digital-to-analog converter.

13. The semiconductor integrated circuit device according to claim 10, wherein the control circuit controls the analog voltage to be applied to the gates of the MOS transistors in the second resistor and the fourth resistor.

14. The semiconductor integrated circuit device according to claim 13, wherein the control circuit controls the analog voltages to be applied to the gates of the MOS transistors in the second resistor and the fourth resistor so as to cancel the temperature dependence of the digital-to-analog converter.

* * * * *